United States Patent
Matsumoto

[19]

[11] Patent Number: 6,093,633
[45] Date of Patent: Jul. 25, 2000

[54] METHOD OF MAKING A SEMICONDUCTOR DEVICE

[75] Inventor: Akira Matsumoto, Tokyo, Japan

[73] Assignee: NEC Corporation, Tokyo, Japan

[21] Appl. No.: 08/807,700

[22] Filed: Feb. 28, 1997

[30] Foreign Application Priority Data

Feb. 29, 1996 [JP] Japan .................................... 8-043312

[51] Int. Cl.$^7$ ............................................ H04L 21/4763
[52] U.S. Cl. .......................... 438/622; 438/619; 438/623; 438/624
[58] Field of Search .................................. 438/619, 622, 438/623, 624

[56] References Cited

U.S. PATENT DOCUMENTS

| | | |
|---|---|---|
| 4,944,836 | 7/1990 | Beyer et al. . |
| 5,310,700 | 5/1994 | Lien et al. ............................. 438/624 |
| 5,444,015 | 8/1995 | Aiken et al. ........................... 438/619 |
| 5,476,817 | 12/1995 | Numata ................................. 438/623 |
| 5,488,015 | 1/1996 | Havemann et al. ..................... 438/624 |
| 5,510,293 | 4/1996 | Numata ................................. 438/622 |
| 5,559,055 | 9/1996 | Chang et al. .......................... 438/619 |
| 5,591,677 | 1/1997 | Jeng ..................................... 438/623 |
| 5,641,711 | 6/1997 | Cho ...................................... 438/624 |
| 5,641,712 | 6/1997 | Grivna et al. .......................... 438/624 |
| 5,698,467 | 12/1997 | Sakao et al. ........................... 438/624 |
| 5,811,352 | 9/1998 | Numata et al. ......................... 438/622 |
| 5,814,558 | 9/1998 | Jeng et al. ............................. 438/623 |
| 5,837,618 | 11/1998 | Avanzino et al. ...................... 438/624 |

FOREIGN PATENT DOCUMENTS

| | | |
|---|---|---|
| 58147045 | 9/1983 | Japan . |
| 61152040 | 7/1986 | Japan . |
| 62 5643 | 1/1987 | Japan . |
| 1-91435 | 4/1989 | Japan . |
| 7-326670 | 12/1995 | Japan . |

*Primary Examiner*—John F. Niebling
*Assistant Examiner*—Lynne A. Gurley
*Attorney, Agent, or Firm*—Sughrue, Mion, Zinn, Macpeak & Seas, PLLC

[57] ABSTRACT

A semiconductor device manufacturing method is provided which can reduce the capacitance between adjacent wires by providing a void between wires, without sacrificing the advantage of the buried wiring method. After successively depositing an interlayer insulation film, a silicon nitride film, and a silicon dioxide film onto a silicon substrate, a wiring groove is formed. Then, after forming a contact hole, a barrier metal and aluminum film are deposited over the entire surface, these being removed from areas other than within the groove, so as to form buried wiring patterns. Then, the silicon dioxide film and silicon nitride films are etched away from areas in which the adjacent wiring space is narrow, thereby exposing the above-noted wiring pattern, after which a second silicon dioxide film is deposited over the entire surface, thereby forming a void in the area in which there is a narrow wiring space between adjacent wires.

9 Claims, 7 Drawing Sheets

METHOD OF MAKING A SEMICONDUCTOR DEVICE

BACKGROUND OF THE INVENTION

1. Field of the Invention

The present invention relates to a method of manufacturing a semiconductor device, and more specifically to a method of forming a void for the purpose of reducing the capacitance between adjacent wires when forming buried wiring patterns in a semiconductor device.

2. Description of Related Art

In recent years, with an increase in the level of integration of semiconductor devices the pitch between wiring conductors in devices has become narrows. When this occurs, the resulting large capacitance between a conductor and adjacent conductors is greatly influenced by changes in potential in an adjacent conductor. This results in reducing the operating margin and leading to the problem of deteriorated performance in the form of misoperation. To solve this problem, there have been methods proposed in the past for providing a void between conductors during the semiconductor manufacturing process. When providing a void between wiring conductors, because of intervening air, which has a small dielectric coefficient, the capacitance between conductors is reduced. An example of the most typical method is that which is disclosed in the Japanese Unexamined Patent Publication (KOKAI) No. 6-5643. That method will be described simply below, with reference being made to FIGS. 3a–3b.

Figure 3A:
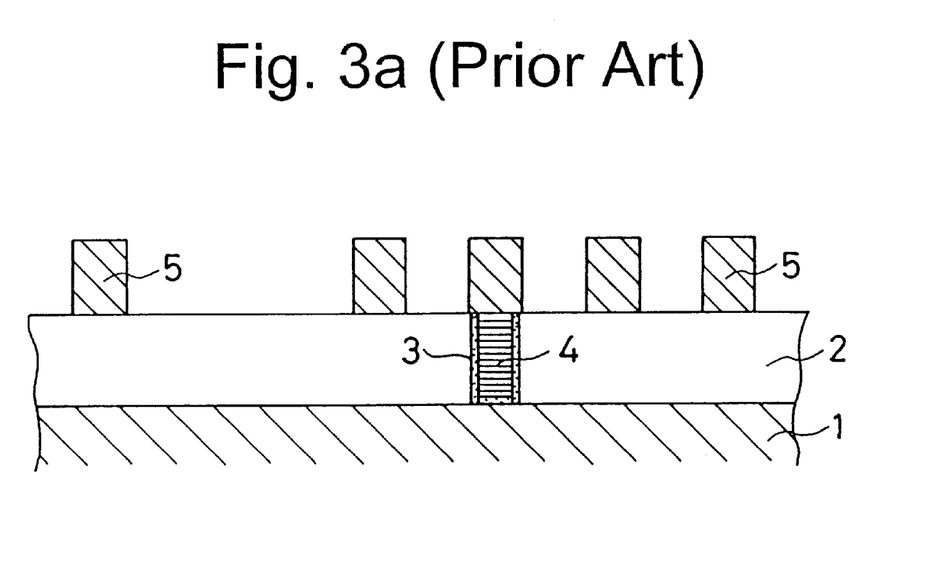
FIGS. 3a and 3b are drawings which show the prior art method of providing a void between wires.

First, as shown in FIG. 3a, an interlayer insulating film 2 is formed on a semiconductor substrate 1, a tungsten plug 4 being formed on a prescribed position with an intervening barrier metal 3 such as titanium or titanium nitride or the like.

Then, an aluminum film or the like is deposited as the wiring metal, and the wiring pattern 5 is formed on this, using conventional photolithography and etching technologies.

Figure 3B:
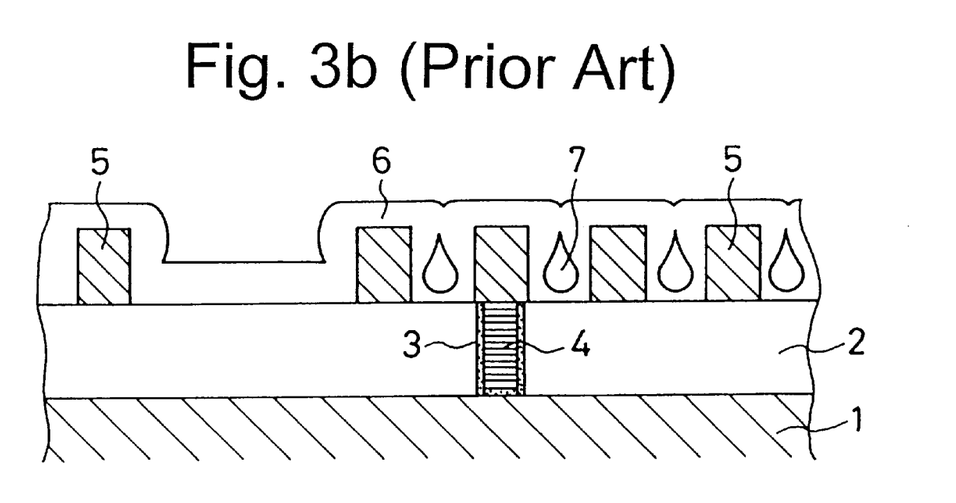

Next, as shown in FIG. 3b, an insulation film 6 is deposited by using the conventional CVD method. By using characteristics of the configuration formed by the CVD process, and protrusions and depressions of the wiring pattern 5, a void 7 is formed between the narrow area between wiring conductor parts.

Multilayer wiring technology is commonly used with an increasing level of integration of semiconductor devices. To prevent breaks in an upper portion of the above-noted when forming the upper layer wiring, it is important to smooth any sudden changes in height formed by the wirings.

The use of a so-called buried conductor, which flattens the upper surface by burying the conductor metal within a groove formed in the base insulation layer has been proposed as an effective means to do this. A method of forming a buried conductor is disclosed, for example, in the Japanese Unexamined Patent Publication (KOKAI) No. 58-147045 and the Japanese Unexamined Patent Publication (KOKAI) No. 61-152040. This method will be explained in brief, with reference being made to FIG. 4.

Figure 4:
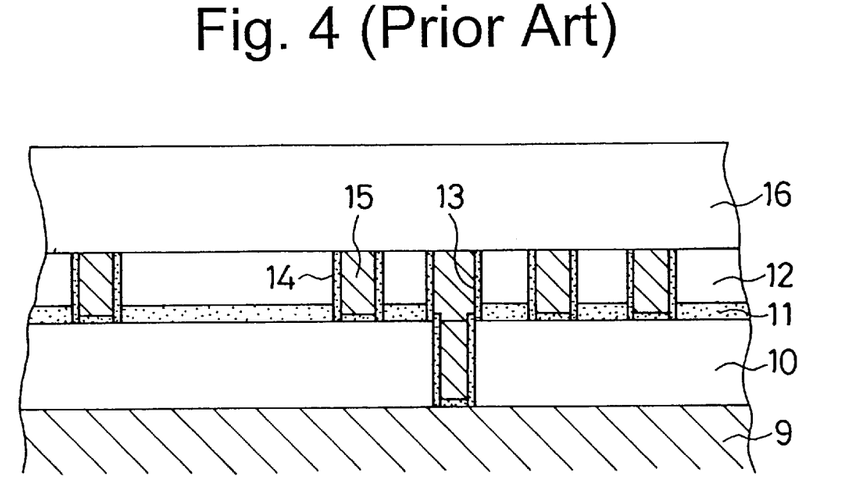
FIG. 4 is a drawing which shows the prior art method of forming buried wiring.

As shown in FIG. 4, after first successively forming an interlayer insulation film 10, a silicon nitride film 11, and a first silicon dioxide film 12 on a semiconductor substrate 9, a groove 13 is formed so as to correspond to the wiring pattern. Next, after successively depositing a barrier metal 14, such as titanium or titanium nitride, and an aluminum film 15 over the entire substrate surface, a method of chemical mechanical polishing (hereinafter referred to as CMP) is used to remove the metal films 14 and 15 from the first silicon dioxide film 12, so as to leave the metal films 14 and 15 only within the groove. Then, the second silicon dioxide film 16 is deposited.

According to this method, it is possible to obtain a flat surface without height irregularities, thereby not only facilitating the formation of an upper pattern with fine features but also preventing breaks in the wiring. Since there is no halation caused by the conductor metal during exposure compared with the wiring formation method of the past, in which the metal conductive film was etched to form the wiring pattern because it is easier to form a fine groove pattern in the insulation film, the formation of a fine wiring pattern is also facilitated.

In addition, according to this method, it is possible to perform self alignment of via-contact holes with the wiring grooves for making contact with the bottom layer electrodes. Further, it is possible to devise a manufacturing method in which the via-contact holes and wiring grooves are filled with metal simultaneously. By doing this, the pattern offset that can occur in the case in which via-contact hole formation and filling are done separately from the wiring pattern formation does not occur.

As described above, with an increase in the level of integration of semiconductor devices, it is desirable to easily use a buried wiring structure for the purpose of facilitating the formation of the upper wiring pattern, and also to provide a void between conductors so as to reduce the capacitance between adjacent conductors.

However, in the above-described previous method of providing a void between conductors, the protrusions and depressions of the wiring pattern and the characteristics of the pattern deposited by using the CVD process are used to form a void between conductors as is clear from FIG. 3b, this does not enable the achievement of a flat surface such as with buried conductors, thereby also making the formation of fine patterns difficult.

In the Japanese Unexamined Patent Publication (KOKAI) No. 1-91435, a method of forming an additional film is disclosed, in which a conductive metal film is deposited first. After a wiring patterns has been formed by utilizing exposure, developing, and etching technologies, an insulating film is deposited over the entire surface thereof. Then exposure, developing, and etching technologies is used to form an additional film of insulating film material in the broad area between wires.

Figure 5:
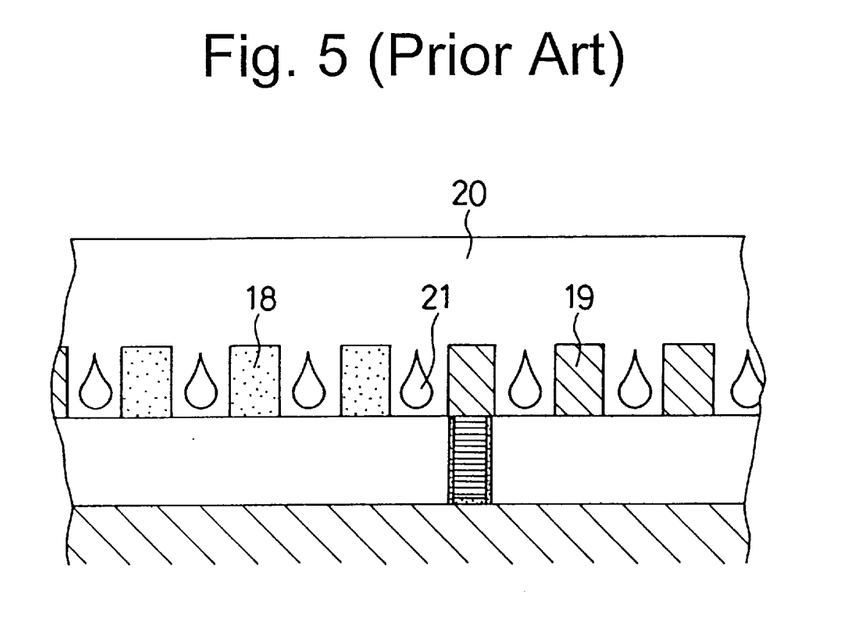
FIG. 5 is a drawing which shows another prior art method of providing a void between wires.

In doing this, after forming a wiring pattern using the etching method of the past, it is possible to provide a void 21 between the narrow area between conductors and achieve a flat surface also by applying the above-described method disclosed in the patent application publication. That is, by forming a projection film 18 having the same thickness of the wiring film 19 and which is provided among the wiring patterns, the pitch thereof being relatively wider than others, as shown in FIG. 5, and then depositing the insulation layer 20 over them.

However, because this method involves the troublesome step of forming an additional film, it does not offer the advantages of the buried conductor method which is a method of forming a wiring pattern, of easy formation of a fine pattern and of the ability to achieve self-alignment of the formation of vias and contact with the wiring pattern.

To solve the above-noted problems, an object of the present invention is to provide a method of manufacturing a semiconductor device which can be used to provide a void formed among these wiring patterns when using the buried conductor method, thereby achieving a reduction of capacitance between adjacent conductors, without sacrificing the advantages of the buried conductor method.

SUMMARY OF THE INVENTION

To achieve the above-noted object, the method of manufacturing a semiconductor according to the present invention has a step which forms a first insulation film over a semiconductor substrate or over a wiring layer and which forms a groove in locations of the first insulation film first corresponding to the wiring pattern, a step which deposits a conductor over the entire surface of the first insulation film, including within the groove, a step which forms a wiring pattern by removing the conductor in parts other than within the groove, leaving the conductor only within the groove, a step which selectively removes the first insulation film corresponding to the narrow areas between adjacent wires, and which exposes this area of the wiring pattern, and a step which forms a void in the second insulation film provided in the narrow areas between adjacent wires by forming a second insulation film over the part of the first insulation film remaining from the previous step and the entire surface of the wiring pattern.

In another form of the present invention, an interlayer insulation film is priorly formed under the first insulation film and a groove is formed in the first insulation film, after which a hole is made in the interlayer insulation film which extends to either the semiconductor substrate or the wiring layer, a conductor being then deposited onto the entire surface of the first insulation film, including this hole and groove, the part of the conductor other than the hole and groove being removed so as to leave the first insulation film only inside the hole and the groove as the wiring pattern.

Another embodiment of a semiconductor manufacturing method of the present invention has a step which forms an interlayer insulation film over a semiconductor substrate or over a wiring layer and which forms a hole in the interlayer insulation film, a step which deposits an electrically conductive plug material over the entire surface of the interlayer insulation film, including the inside of the hole, a step which, by removing the plug material from parts other than the inside of the hole, forms a plug by leaving plug material just inside the hole, a step which deposits a first insulation film over the entire surface of the interlayer insulation film and plug, a step which forms a groove in a location which corresponds to the locations of the first insulation film corresponding to the wiring pattern of the first insulation film, a step which deposits a conductor over the entire surface of the first insulation film, including within the groove, a step which forms a wiring pattern by removing the conductor in parts other than within the groove, leaving the conductor only within the groove, a step which selectively removes the first insulation film corresponding to the narrow areas between adjacent wires, and which exposes this area of the wiring pattern, and a step which forms a void in a second insulation film provided in the narrow areas between adjacent wires, by forming a second insulation film over the part of the first insulation film remaining from the previous step and the entire surface of the wiring pattern.

It is also possible to form, between the first insulation film and the interlayer insulation film, an etch-stopping film of a material having a large etching selection ratio with respect to the first insulation film. It is desirable that the wiring pitch in the narrow part between adjacent wires be in a range from the minimum wiring pitch of the manufacturing process to three times that wiring pitch.

In the present invention, after forming buried wiring made of a conductor, the first insulation layer is patterned to expose the wiring pattern in the narrow area between adjacent wires, thus enabling the formation of a void in the area between closely space wires when depositing the second insulation film. In a part in which the wiring pitch is not narrow, because the first insulation film remains, the overall top surface of the second insulation film is flat.

DETAILED DESCRIPTION OF THE PREFERRED EMBODIMENTS

The first embodiment of the present invention will next be described, with reference being made from FIG. 1a through FIG. 1f.

FIG. 1a through FIG. 1f are process flow diagrams which presents the sequence of processing in this embodiment of a semiconductor manufacturing method according to the present invention. In the description to follow, only the wiring formation, which is the feature of the present invention, will be described. Other elements existing within the semiconductor device, such as transistors and capacitors, are omitted from the description.

Figure 1A:
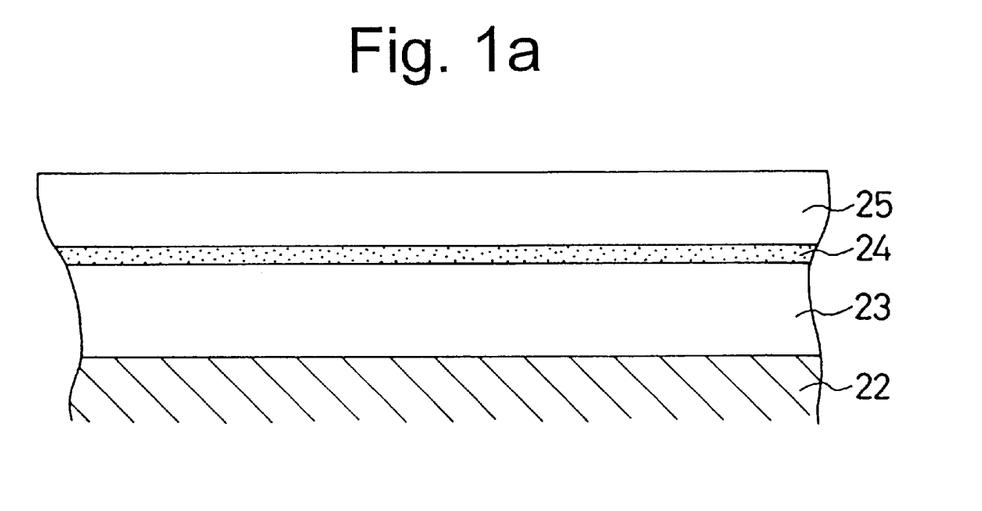
FIGS. 1a and 1b are process flow drawings which show the process sequence in the first embodiment of a semiconductor device manufacturing method according to the present invention.
Figure 1B:
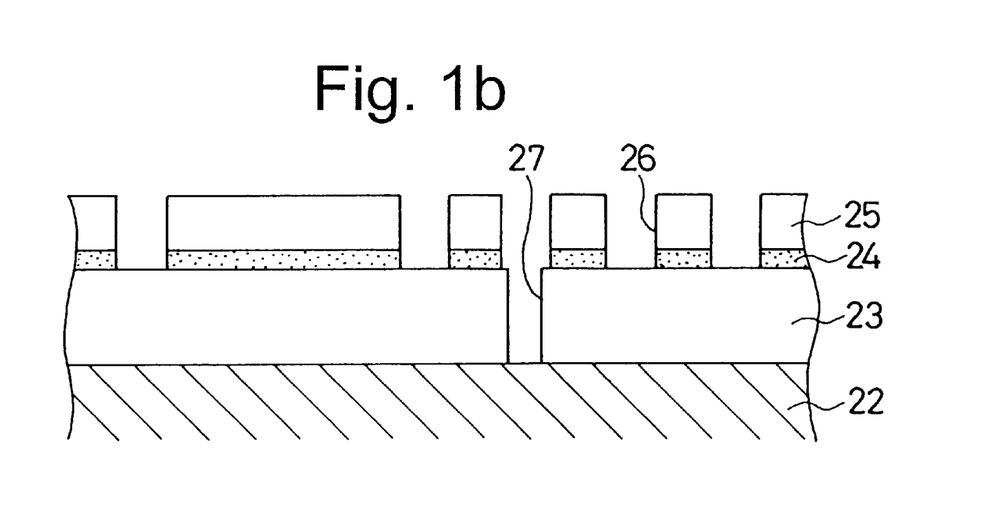

First, referring to FIG. 1a, over the entire surface of the silicon substrate 22 (semiconductor substrate), which has an element region, are formed successive depositions that include an interlayer insulation film 23, a silicon nitride film 24 (etch-stopping film) having a thickness of 50 nm, and a first silicon dioxide film 25 (first insulation film) having a thickness of 500 nm. Next, as shown in FIG. 1b, using a widely known photolithographic etching technique, a wiring groove 26 having the same pattern as the wiring pattern is formed in the first silicon dioxide film 25. In the case in which this wiring groove 26 is formed using dry etching, because the etching is stopped by the silicon nitride film 24 under the first silicon dioxide film 25, it is possible to achieve a groove having a uniform depth. Dry etching is then used to remove the silicon nitride film 24 at the bottom of the wiring groove 26.

Next, after removing the photoresist which was used when forming the wiring groove, a widely known photolithographic etching technique is used to make a prescribed contact hole 27 having a radius of 0.5 μm in the interlayer insulation film 23 within the wiring groove 26. In this manner, the contact hole 27 can be formed so as to be self-aligned with the wiring groove 26, enabling electrical contact to be made between the wiring to be formed later and the element region of the silicon substrate 22.

Figure 1C:
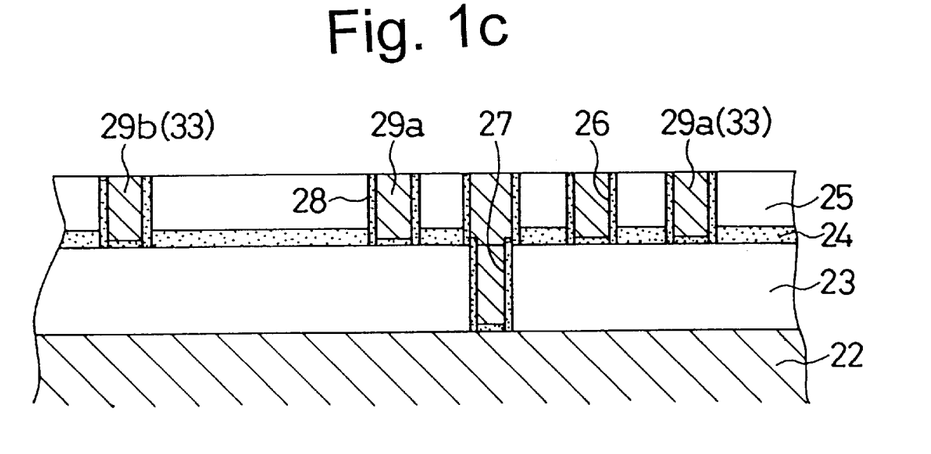
FIGS. 1c and 1d are the continuation of the process flow drawings of the first embodiment of a semiconductor device manufacturing method according to the present invention.

Next, as shown in FIG. 1c, the sputtering method is used to continuously deposit a titanium film and then a titanium nitride film over the entire surface of the substrate, including the wiring groove 26 and the part inside the contact hole 27. The titanium film and titanium nitride film serves as a barrier metal 28 and the thicknesses of these films is, for example, 50 nm for the titanium film and 100 nm for the titanium nitride film.

Next, using the CVD process an aluminum film 33 (conductor) of approximate thickness 600 nm is formed over the entire surface of the substrate, including the wiring groove 26 and inside the contact hole 27, after which the CMP process is used to remove the aluminum film 29 and the barrier metal 28 except for inside the wiring groove 26 and the contact hole 27, thus forming the wiring patterns 29a and 29b of aluminum which is buried within the wiring groove 26. By this process, the formation of a buried wire with a flat surface is completed. In this aspect of the embodiment, the minimum width and the minimum space of wires are both 0.5 μm.

Figure 1D:
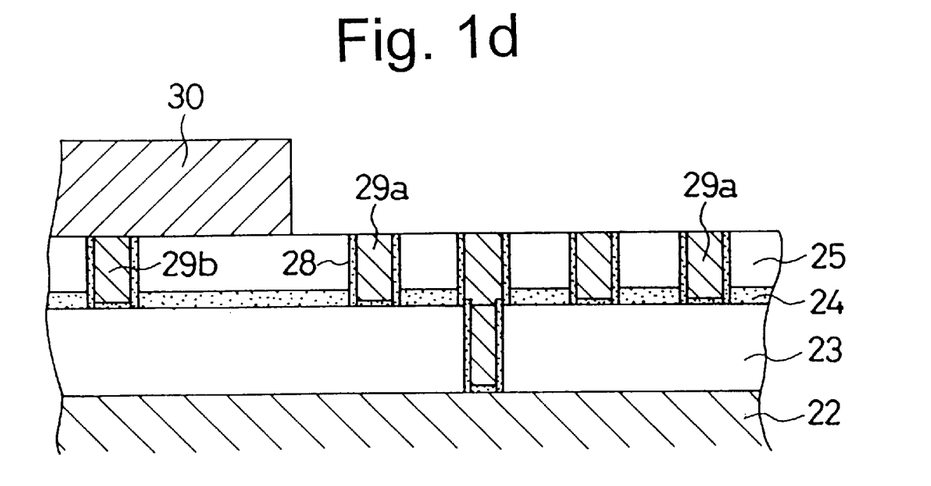

Thereafter, photoresist is applied to the entire surface and a mask pattern is used to expose and then develop using widely known techniques, this resulting, as shown in FIG. 1d, in removal of only the photoresist in the area between locations in which the wiring pitch between adjacent wires is narrow, with photoresist 30 being left in other areas. For example, in this form of the embodiment of the present invention, because the minimum wiring space is 0.5 μm, a mask pattern is used so as to enable removal of photoresist in the part in which the wiring space is 0.5 μm.

Figure 1E:
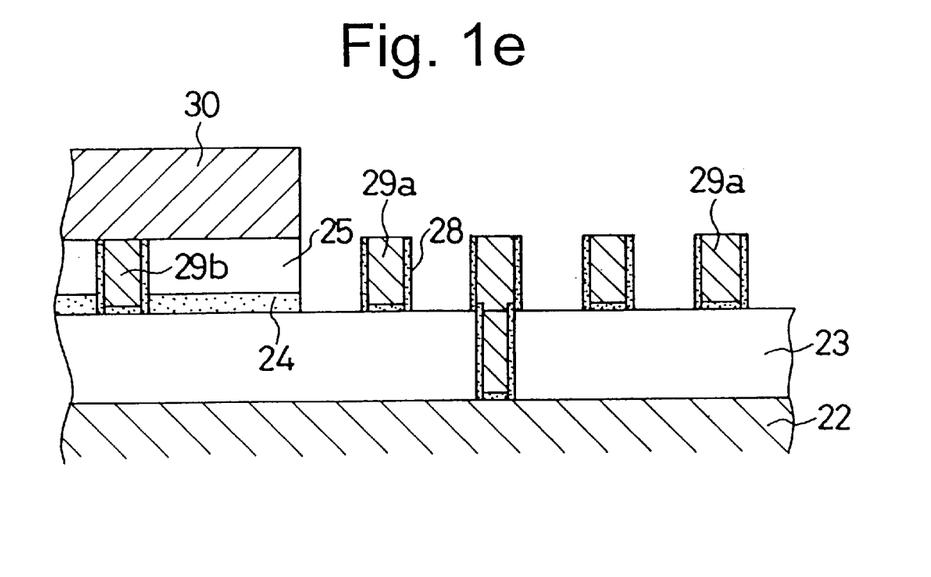
FIGS. 1e and 1f are the continuation of the process flow drawings of the first embodiment of a semiconductor device manufacturing method according to the present invention.

As shown in FIG. 1e, if dry etching is performed using this photoresist as a mask, the first silicon dioxide film 25 between wires 29a is removed, so as to expose the wiring pattern 29a. This dry etching is continued until the silicon nitride film 24 is removed.

Figure 1F:
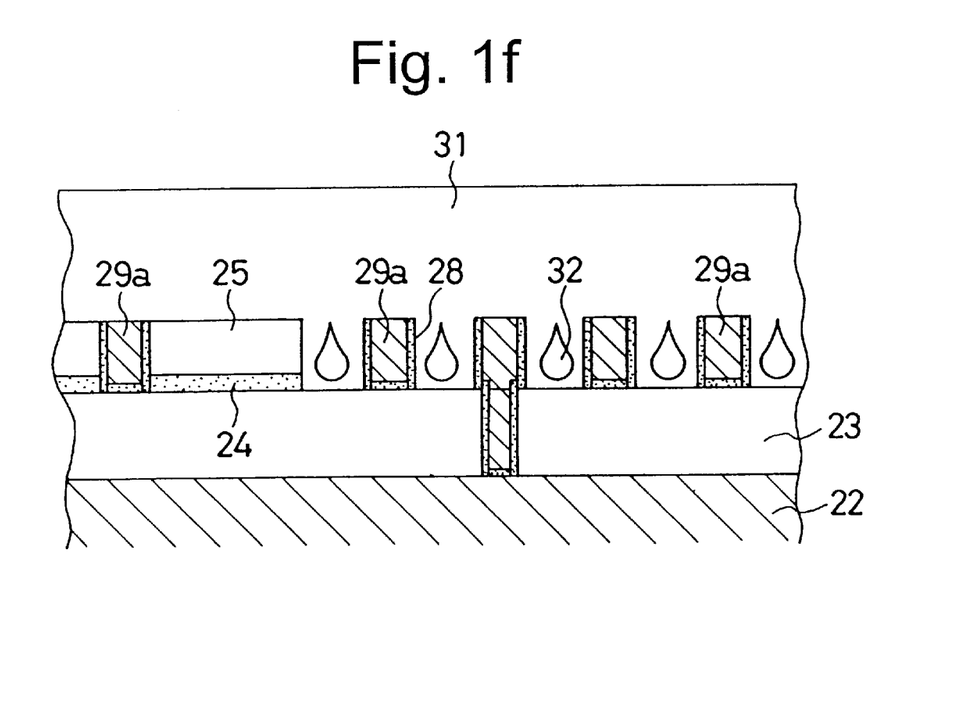

Next, after removing the photoresist 30, as shown in FIG. 1f, the CVD process is used to deposit a second silicon dioxide file 31 (second insulation film) having a thickness of approximately 1.0 μm over the entire surface of the substrate. By doing this, a void 32 is formed in the area in which the wiring space is narrow, from which the first silicon dioxide film 25 had been previously removed. By appropriately setting the CVD process film deposition conditions, it is easy to form a void 32 in the area in which the wiring space is narrow. Then the same type of processes are repeated, and when the upper wiring layer or protective film are formed, the multilayer wiring is complete.

According to this form of the embodiment of the present invention, because the wiring patterns 29a and 29b are themselves formed by the buried wiring method, it is possible to achieve a sufficiently flat surface, and easy to form a fine pattern. Thereby providing the advantage of the buried wiring method, which is to achieve self-alignment between the via-contact hole formation and the wiring pattern.

In doing this, by merely adding an appropriate CVD film deposition step to one photolithographic step, it is possible to easily form the void 32 in an area in which the wiring space is narrow, and thus the capacitance existing between two wiring patterns adjacently arranged to each other, can be reduced.

In addition, because the depression between the wiring patterns 29a exists only in the area in which the wiring space is narrow, the first silicon dioxide film 25 remaining in regions in which the wiring space is wide, after depositing the second silicon dioxide film 31, having a thickness of 1 μm, the upper surface of this film is sufficiently flat.

The area in which the wiring space is narrow, as stated above, is preferably an area in which the wiring space ranges from approximately the same as the minimum wiring space to approximately three times this minimum wiring space. Therefore, in this form of the embodiment, the area having a narrow wiring space is one in which the wiring space is in the range of 0.5 to 1.5 μm. In an area in which the wiring space is wider than this, if the first silicon dioxide film 25 is removed, the top surface thereof will not be flat, even if the second silicon dioxide film 31 is deposited.

In the present invention, the term "the wiring space formed between the wiring patterns adjacently arranged to each other is narrow" is outlined as a minimum space formed between two adjacently arranged wiring patterns as defined by a designing rule as previously set for manufacturing a semiconductor device which should be produced and up to a space three times of the minimum space thereof.

However, up to two times of the minimum space thereof would be preferable.

Further, when the first insulation film which has been formed over the wiring patterns the pitch thereof being relatively narrow, should be removed, the above-mentioned mask-pattern can be used and it can easily be formed by utilizing pattern data as already stored in the computer.

Note, that when such a mask pattern should be formed, the pattern data of the wiring patterns which are in the included area in which the pitch formed among the plurality of the wiring patterns are relatively narrow, is first detected, then each of the pattern data of the respective wiring patterns is widened in processing by the computer so as to form a new area covering one or more than one of the wiring patterns in a memory inside the computer.

Then, a mask to be used in such removing operation, can be formed by forming an aperture or a window on an entire surface of the mask which corresponds to the above-mentioned expanded area formed from each one of the wiring pattern data.

The second embodiment of the present invention is described below, with reference being made to FIGS. 2a–2d.

FIGS. 2a–2d are process flow diagrams which show the sequence of processing steps in this embodiment of a semiconductor manufacturing method according to the present invention.

Figure 2A:
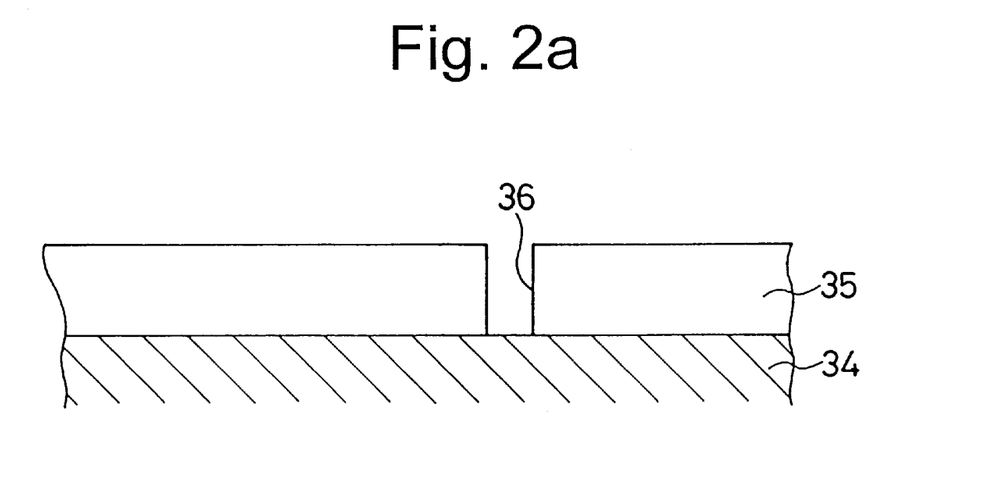
FIGS. 2a and 2b are process flow drawings which show the process sequence in the second embodiment of a semiconductor device manufacturing method according to the present invention.

First, as shown in FIG. 2a, an interlayer insulation film 35 having a thickness of 1 μm is formed over the entire surface of the silicon substrate 34 (semiconductor substrate), which has an element region, followed by the use of widely known photolithographic etching technology to make a contact hole 36 having a radius of 0.3 μm in the interlayer insulation film 35. This contact hole is for the purpose of making an electrical connection between a wire and the element region of the silicon substrate 34.

Figure 2B:
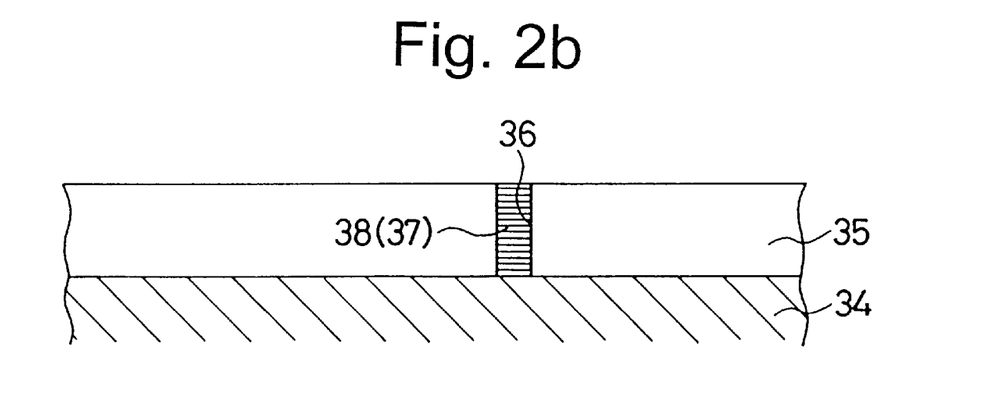

Next, after removing the photoresist that was used when the contact hole was formed, as shown in FIG. 2b, a selective CVD process is used to deposit tungsten 37 (plug material) within the contact hole 36. Then the CMP process is used to remove excess tungsten, thereby forming the plug 38 which fills the contact hole 36 and also makes the surface thereof flat.

Figure 2C:
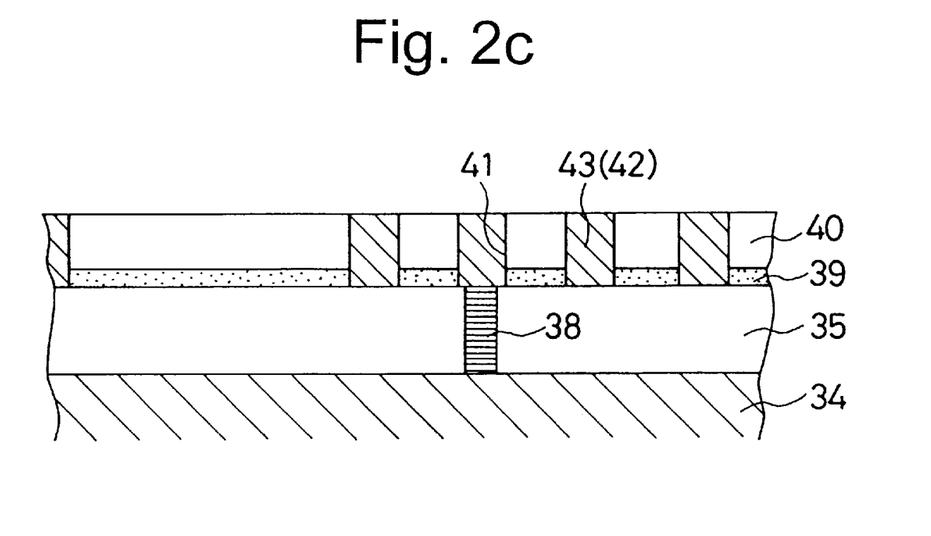
FIGS. 2c and 2d are the continuation of the process flow drawings of the second embodiment of a semiconductor device manufacturing method according to the present invention.

Thereafter, a silicon nitride film 39 (etch-stopping film) having a thickness of 50 nm and a first silicon dioxide film 40 (first insulation film) having a thickness of approximately 500 nm are successively deposited over the entire surface. Then, as shown in FIG. 2c, using a widely known photolithographic technique, a wiring groove 41 having the same pattern as the wiring pattern is formed on the first silicon dioxide film 40. The width of the wiring groove 41 is, for example, 0.3 μm.

This etching is performed as one etching step which is stopped at the silicon nitride film 39, after which by performing another etching which goes through the silicon nitride film 39, it is possible to achieve a uniform depth of the wiring groove 41. The depth of this wiring groove 41 is 0.55 μm.

Next, after removing the photoresist that was used in forming the wiring groove, an aluminum film 42 (conductor) having a thickness of approximately 600 μm is formed on the entire surface of the substrate, including the inside part of the wiring groove 42, using the CVD process.

Following this, the CMP process is used to remove the aluminum film 42 from parts other than the inside of the wiring groove 41, thus forming a wiring pattern of aluminum. By this process, the formation of a buried wire with a flat surface is completed.

Figure 2D:
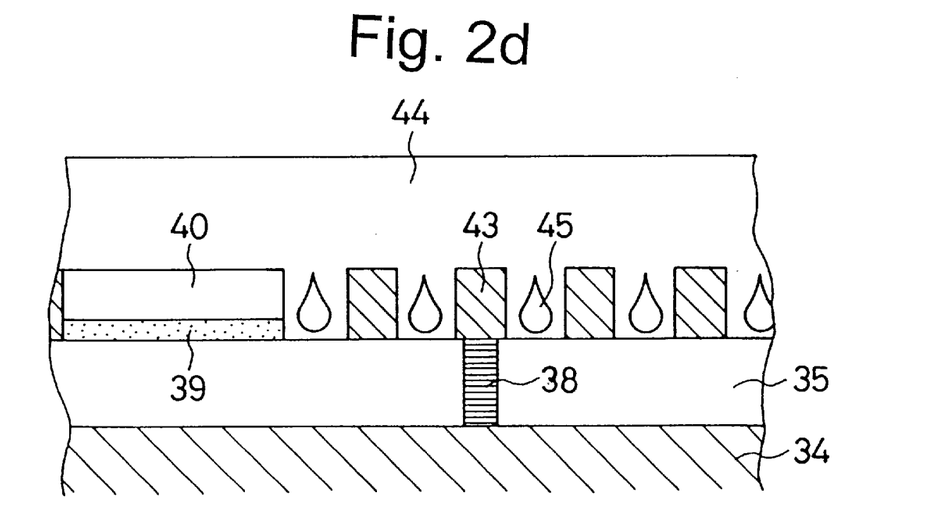

Thereafter, by using process steps that are the same as described with regard to the first embodiment, as shown in FIG. 2d, the first silicon dioxide film 40 is removed in the area in which the wiring space is narrow, thereby exposing the wiring pattern, after which by depositing the second silicon dioxide film 44 (second insulation film) over the entire surface it is possible to form a void 45 in the area in which the wiring space is narrow. After this, the same steps are repeated, and when the upper wiring layer or protective film are formed, the multilayer wiring is complete.

In this form of the embodiment of the present invention as well, by providing a void 45 in an area in which the wiring space is narrow, it is possible to reduce the capacitance between wires without sacrificing the advantage of buried wiring, thereby achieving the same effect as the first embodiment of the present invention.

In addition, in this second embodiment, even if the contact hole 36 and wiring groove 41 dimensions are small, making it impossible to fill by sputtering a barrier metal such as titanium nitride from an upper side of the first silicon dioxide film 40, it is possible to fill plugs and wiring metal, thereby enabling the provision of a manufacturing method suitable for extremely fine semiconductor devices.

The technical scope of the present invention is not limited to the above-described embodiments, and can be changed variously within the scope of the import thereof. For example, it is possible to appropriately change the type of various films and the thicknesses thereof. Also, while in the described embodiments the example of forming a wiring pattern on a semiconductor substrate was presented, it is of course also possible to apply the present invention to the formation of a wiring pattern on a lower wiring layer of a semiconductor device. As explained, the semiconductor device of the present invention has the following technical features:

That is, a semiconductor device in which a plurality of wiring patterns are provided on one main surface of a semiconductor substrate and the wiring patterns being covered by an insulation film and a part of the wiring patterns forming a first group in which a wiring space of the wiring patters formed among them being narrow. The rest of the wiring patterns forming a second group in which a wiring space of the wiring patters formed among them being wider than that of the first group. The device is further characterized in that voids are formed in the insulation film provided among the wiring patterns belonging to the first group and a first insulation film covering the first group of wiring patterns and a second insulation film covering the second group of wiring patterns being formed thereon in different steps in the semiconductor device manufacturing steps.

As described in detail above, in accordance with the semiconductor manufacturing method of the present invention, because it is possible to form the wiring pattern itself using the buried wiring method, it is possible to achieve sufficient surface flatness and easy to form a fine pattern. Further, it is possible to achieve self-alignment between the contact hole formation and the wiring pattern, thereby maintaining the advantages of the buried wiring method.

In doing this, by merely adding an appropriate CVD film deposition step to one photolithographic step, it is possible to easily form a void in an area in which the wiring space is narrow, thereby reducing the capacitance between adjacent wires.

For example, in the case in which the void width is ⅓ the wiring space the wire-to-wire capacitance is reduced to approximately ½ of what it is in the case in which there is no void. In addition, because the depression between the wiring patterns exists only in the area in which the wiring space is narrow, the first insulation film remains in regions in which the wiring space is not narrow, so that top surface of the second insulation film is sufficiently flat, thereby providing a semiconductor device manufacturing method that is suitable for multilayer wiring.

What is claimed is:

1. A semiconductor device manufacturing method comprising:

a step forming a first insulation film over a semiconductor substrate or over a wiring layer and forming a plurality of grooves in locations of said first insulation film corresponding to a wiring pattern;

a step depositing a conductor over the entire surface of said first insulation film, including within said grooves;

a step forming said wiring pattern by removing the conductor in parts other than within said grooves, leaving said conductor only within said grooves;

a step selectively removing said first insulation film corresponding to a narrow wiring space, and selectively maintaining said first insulation film corresponding to a wide wiring space, in which the removing of said first insulation film exposes said wiring pattern; and a step forming a void in a second insulation film provided in an area of said narrow wiring space by forming said second insulation film over said first insulation film corresponding to said wide wiring space and the entire surface of said wiring pattern.

2. A semiconductor device manufacturing method according to claim 1, wherein an interlayer insulation film is priorly formed under said first insulation film and said grooves are formed in said first insulation film, after which a hole is made in said interlayer insulation film which extends to either said semiconductor substrate or said wiring layer, said conductor being then deposited onto the entire surface of said first insulation film, including inside said hole and said grooves, the part of said conductor other than said hole and said grooves being removed so as to leave said conductor only inside said hole and said grooves as the wiring pattern.

3. A semiconductor device manufacturing method according to claim 1, wherein said step of selectively maintaining said first insulation film corresponding to said wide wiring space includes removing at least one portion which is substantially equivalent to said area of said narrow wiring space.

4. A semiconductor device manufacturing method comprising:
- a step forming an interlayer insulation film over a semiconductor substrate or over a wiring layer and forming a hole in said interlayer insulation film;
- a step depositing an electrically conductive plug material over the entire surface of said interlayer insulation film, including the inside of said hole;
- a step which, by removing said plug material from parts other than the inside of the hole, forms a plug by leaving said plug material only inside said hole;
- a step depositing a first insulation film over the entire surface of said interlayer insulation film and said plug;
- a step forming a plurality of grooves in a location which corresponds to the locations of the first insulation film corresponding to a wiring pattern of the first insulation film;
- a step depositing a conductor over the entire surface of said first insulation film, including within said grooves;
- a step forming said wiring pattern by removing the conductor in parts other than within said grooves, leaving the conductor only within said grooves;
- a step selectively removing said first insulation film corresponding to a narrow wiring space, and selectively maintaining said first insulation film corresponding to a wide wiring space, in which the removing of said first insulation film exposes said wiring pattern; and
- a step forming a void in a second insulation film provided in an area of said narrow wiring space by forming said second insulation film over said first insulation film corresponding to said wide wiring space and the entire surface of said wiring pattern.

5. A semiconductor device manufacturing method according to claim 1, wherein an etch-stopping film is made of a material that has a high etching selectivity ration with respect to said first insulation film and is formed between said first insulation film and said interlayer insulation film.

6. A semiconductor device manufacturing method according to claim 4, wherein an etch-stopping film is made of a material that has a high etching selectivity ration with respect to said first insulation film and is formed between said first insulation film and said interlayer insulation film.

7. A semiconductor device manufacturing method according to claim 1, wherein said narrow wiring space is in a range from approximately a minimum wiring space to approximately three times said minimum wiring space.

8. A semiconductor device manufacturing method according to claim 4, wherein said narrow wiring space is in a range from approximately a minimum wiring space to approximately three times said minimum wiring space.

9. A semiconductor device manufacturing method according to claim 4, wherein said step of selectively maintaining said first insulation film corresponding to said wide wiring space includes removing at least one portion which is substantially equivalent to said area of said narrow wiring space.

* * * * *

UNITED STATES PATENT AND TRADEMARK OFFICE
CERTIFICATE OF CORRECTION

PATENT NO.: 6,093,633
DATED: July 25, 2000
INVENTOR(S): Akira MATSUMOTO

It is certified that error(s) appears in the above-identified patent and that said Letters Patent is hereby corrected as shown below:

Column 1, line 15, delete "narrows" insert --narrow--.

Column 5, line 45 delete "file" insert --film--.

Column 7, line 5, delete "2c" insert --2d--;

line 18, delete "µm" insert --nm--.

Signed and Sealed this

Seventeenth Day of April, 2001

NICHOLAS P. GODICI

*Attest:*

*Attesting Officer*   Acting Director of the United States Patent and Trademark Office